United States Patent
Gierak

(10) Patent No.: US 8,101,925 B2
(45) Date of Patent: Jan. 24, 2012

(54) INSTALLATION AND METHOD OF NANOFABRICATION

(75) Inventor: Jacques Gierak, Le Plessis Pate (FR)

(73) Assignee: Centre National de la Recherche Scientifique—CNRS, Paris (FR)

( * ) Notice: Subject to any disclaimer, the term of this patent is extended or adjusted under 35 U.S.C. 154(b) by 517 days.

(21) Appl. No.: 12/279,888

(22) PCT Filed: Feb. 16, 2007

(86) PCT No.: PCT/FR2007/000287
§ 371 (c)(1),
(2), (4) Date: Aug. 19, 2008

(87) PCT Pub. No.: WO2007/096505
PCT Pub. Date: Aug. 30, 2007

(65) Prior Publication Data
US 2009/0095923 A1    Apr. 16, 2009

(30) Foreign Application Priority Data
Feb. 20, 2006   (FR) ..................... 06 01483

(51) Int. Cl.
*G21G 5/00*   (2006.01)
(52) U.S. Cl. ............ 250/492.21; 250/492.1; 250/492.2; 250/492.3
(58) Field of Classification Search ........... 250/492.1, 250/492.2, 492.21, 492.22, 492.3; 355/53, 355/55, 57
See application file for complete search history.

(56) References Cited

U.S. PATENT DOCUMENTS

| | | | |
|---|---|---|---|
| 5,122,663 | A | 6/1992 | Chang et al. |
| 5,150,392 | A | 9/1992 | Hohn et al. |
| 5,936,251 | A | 8/1999 | Gierak et al. |

(Continued)

FOREIGN PATENT DOCUMENTS

DE   102004032451 A1   1/2006
(Continued)

OTHER PUBLICATIONS

Lüthi Roli et al.; Parallel Nanodevice Fabrication Using a Combination of Shadow Mask and Scanning Probe Methods; Applied Physics Letters, AIP, American Institute of Physics; Melville, NY, US; vol. 75, No. 9; Aug. 30, 1999; pp. 1314-1316; (XP012024706).

(Continued)

*Primary Examiner* — Michael Maskell
(74) *Attorney, Agent, or Firm* — Osler, Hoskin & Harcourt LLP

(57) ABSTRACT

Nanofabrication installation comprising: a specimen holder, for holding a specimen; a mask, having a through-opening between the upper and lower faces of the mask, for letting charged particles through onto the specimen holder; a near-field detection device for detecting a relative position between the mask (8) and the specimen holder (3); and a displacement device for generating a relative movement between the mask (8) and the specimen holder (3) independently of the relative position between the source (1) and the mask (8), the mask including at least a first electrode in the through-opening (10).

26 Claims, 4 Drawing Sheets

U.S. PATENT DOCUMENTS

| | | | |
|---|---|---|---|
| 6,313,905 B1 * | 11/2001 | Brugger et al. | 355/55 |
| 6,878,930 B1 * | 4/2005 | Willoughby et al. | 250/281 |
| 7,002,166 B2 | 2/2006 | Jamieson et al. | |
| 7,126,139 B2 * | 10/2006 | Schenkel et al. | 250/492.22 |
| 2002/0011560 A1 * | 1/2002 | Sheehan et al. | 250/283 |
| 2006/0071175 A1 * | 4/2006 | Kim et al. | 250/396 R |
| 2006/0124866 A1 * | 6/2006 | Hisatsugu | 250/492.2 |
| 2006/0177594 A1 * | 8/2006 | Nickel | 427/523 |

FOREIGN PATENT DOCUMENTS

| | | |
|---|---|---|
| GB | 2340991 A | 3/2000 |
| WO | 9602065 A1 | 1/1996 |
| WO | 0067290 A2 | 11/2000 |
| WO | 03107375 A2 | 12/2003 |

OTHER PUBLICATIONS

Hammel E. et al.; Masked Ion Beam Lithography for Proximity Printing, Microelectronic Engineering; Elsevier Publishers BV; Amsterdam, NL; vol. 30, No. 1-4; Jan. 1996; pp. 241-244; (XP004597503).

Phan Ngoc Minh et al.; Utilization of Carbon Nanotube and Diamond for Electron Field Emission Devices; Micro Electro Mechanical Systems, 2004, 17Th IEEE International Conference On.; Maastricht, NL; Jan. 25, 2004; pp. 430-433; (XP010767917).

Zahl Percy et al.; All-In-One Static and Dynamic Nanostencil Atomic Force Microscopy/Scanning Tunneling Microscopy System; Review of Scientific Instruments, American Institute of Physics, US; vol. 76, No. 2; Jan. 20, 2005; pp. 23707-23707 (XP012079181).

Meister A. et al.; Nanoscale Dispensing of Liquids Through Cantilevered Probes; Microelectronic Engineering; Elsevier Publishers BV; Amsterdam, NL; vol. 67-68, Jun. 2003; pp. 644-650 (XP004428930).

International Search Report from PCT/FR2007/000287; Zuccatti, Stefano, Oct. 30, 2007.

Vieu C. et al.; Gold Nanograins Deposited from a Liquid Metal Ion Source; Microelectronic Engineering; Elseviers Publishers BV; vol. 35, 1997; pp. 349-352.

Pepin A. et al.; Temperature Evolution of Multiple Tunnel Junction Devices Made with Disordered Two-Dimensional Arrays of Metallic Islands; Applied Physics Letters; vol. 74, No. 20; May 17, 1999; pp. 3047-3049.

Vieu C. et al; Coulomb Blockade Devices Fabricated by Liquid Metal Ion Source Droplet Deposition; J. Vac Sci Technol B16(6); Nov./Dec. 1998; pp. 3789-3794.

Kim G.M. et al.; Fabrication and Application of a Full Wafer Size Micro/Nanostencil for Multiple Length-Scale Surface Patterning; Microelectronic Engineering; Elsevier Publishers BV; vol. 67-68 (2003); pp. 609-614.

* cited by examiner

INSTALLATION AND METHOD OF NANOFABRICATION

CROSS-REFERENCE TO RELATED APPLICATIONS

This application is the United States National Stage Entry of International Application No. PCT/2007/FR000287, entitled "Nanofabrication Installation and Process", filed Feb. 15, 2007. Through the '287 application, this application claims the benefit of priority to French Patent Application No. 0601483, entitled "Installation et procéde dé nano-fabrication", filed on Feb. 20, 2006.

FIELD OF THE DISCLOSURE

The present invention relates to installations and methods of nanofabrication.

BACKGROUND OF THE DISCLOSURE

More particularly, the invention mainly relates to a nanofabrication installation comprising:
a sample holder for receiving a sample having a surface,
a mask for forming the sample comprising
  a lower face oriented towards the sample holder,
  an upper face opposite to the lower face and arranged for receiving a particle beam emitted by a source in the direction of the sample holder to form the sample,
  and at least one through-opening between the upper and lower faces, arranged to allow a portion of said particles to pass through it in the direction of the sample holder,
a device for near-field detection arranged for detecting a desired relative position of said mask and said sample,
a displacement device arranged for generating a relative movement of said mask and said sample holder in order to position the mask and the sample in said desired relative position, independently of the relative position of the source and the mask.

Document U.S. Pat. No. 6,313,905 describes an example of an installation of this kind. An evaporative source emits clusters, droplets or particles of matter, through an opening formed in the cantilever of an atomic force microscope (AFM), which is used for monitoring a position of the mask relative to the sample during deposition through the opening.

However, such a device is not completely satisfactory. Indeed, studies showed that such installation presented problems of reproducibility in the formation of a deposit on the sample surface. In fact, the user has no control over the evaporated particles once they have been emitted by the source. Consequently, after deposition it is necessary to verify whether the surface has been formed in the desired manner, for example by imaging the surface.

SUMMARY OF THE DISCLOSURE

The purpose of the present invention is to remedy these drawbacks.

For this purpose, according to the invention, an installation of the type in question is characterized in that the mask comprises at least one first electrode at the level of the through-opening arranged to electrically interact with the electrically charged particles passing through the opening.

Owing to these arrangements, when the electrically charged particles, either in the form of elementary particles (ions), or grouped in clusters or droplets, are emitted, for example by a point source, for example of the liquid metal ion type, there is interaction with the particles in very close proximity to the sample. Said electrical interaction can consist of control of the trajectory and/or of the energy of the particles during their passage towards the sample, or electrical detection of their arrival on the sample itself.

In preferred embodiments of the invention, it is optionally possible to have recourse additionally to one and/or another of the following arrangements:

said mask additionally has at least one second electrode, the first electrode being positioned between the second electrode and the sample holder, said second electrode being positioned at the level of the through-opening, said electrodes and the surface of the sample together forming an electrostatic lens adapted to exert an electrical influence on the movement of said electrically charged particles as they pass through the opening, when an electric potential is applied to said electrodes;

the installation comprises a generator arranged for generating an electric potential in at least one structure selected from the first electrode, the second electrode and the surface of the sample;

said first electrode is located on the lower face of said mask;

the installation comprises a detector connected to said lower electrode, arranged for detecting electrical elementary particles detached from the sample when the particles passing through the opening reach the surface;

the installation comprises a generator arranged for generating an electric potential between said first electrode and the sample, in order to exert an influence on the kinetic energy of the particles between the mask and the sample;

the device for near-field detection comprises a head that is movable relative to the sample holder in the vicinity of the sample surface, said head being positioned in a known relative position in relation to said mask;

said head and said mask are integrally movable in a plane substantially parallel to the sample surface;

the head comprises a tip and a flexible cantilever, said mask being formed in a reduced-thickness portion of the cantilever;

the through-opening comprises a narrow slit extending transversely to the path of the particles to the sample holder;

the installation comprises at least one source arranged for emitting said beam of electrically charged particles in the direction of the sample holder in order to form the sample;

the installation comprises a beam shaping device arranged between said source and said sample holder, said shaping device being arranged for implementing at least one of the following arrangements:
  concentration of the particles emitted by the source into clusters,
  filtering of the clusters having at least one desired characteristic selected from electric charge, mass, and the ratio of electric charge to mass,
  deflection of the clusters in the direction of the mask;

the installation comprises a plurality of sources each arranged to emit particles of a different material in the direction of said sample holder;

the mask comprises a plurality of through-openings, and a first electrode at the level of each respective through-opening, each first electrode being arranged to interact electrically with the electrically charged particles passing through the corresponding opening;

the installation comprises a plurality of sources each arranged to emit particles in the direction of said sample holder through a corresponding opening;

the installation comprises a source positioning system arranged for detecting the relative position of the source and the mask;

said positioning system comprises the source itself, configured in the form of a near-field microscopy tip, and having on its outer surface the material forming said particles, said tip being arranged, in a first operating mode, for detecting the relative position of the tip and the mask and, in a second operating mode, for emitting said particles;

the source comprises a reservoir of said material, and a heating device for liquefying the material contained in the reservoir in order to cause the latter to flow along the tip of the source;

the source is arranged to form said opening.

According to another aspect, the invention mainly relates to a method of nanofabrication in which:

a) a device for near-field detection detects a desired relative position of a forming mask and a surface of a sample arranged on a sample holder, b) a displacement device generates a relative movement of said mask and of said sample holder in order to position the mask and the sample in said desired relative position, independently of the relative position of a source and the mask, Said mask for forming the sample comprising:
a lower face oriented towards the sample holder,
an upper face opposite to the lower face,
and at least one through-opening between the upper and lower faces, c) the sample is formed by causing the source to emit a particle beam in the direction of the sample holder, a portion of said particles passing through the through-opening in the direction of the sample holder, in the course of step c), the source emits electrically charged particles, and d) there is electrical interaction with the particles passing through the through-opening by means of at least one first electrode of the mask arranged at the level of the through-opening.

In certain embodiments, one and/or other of the following arrangements can be employed:

in the course of step c), a particle reaches said surface of the sample, in order to form said surface, and detaches an electrically charged elementary particle from said surface, and in the course of step d), there is interaction with the particles passing through the opening by detecting said electrically charged elementary particle with said first electrode;

in the course of step d), there is interaction with the particle passing through the opening by generating a potential difference between said first electrode and the surface, in order to exert an influence on the kinetic energy of said particle at the moment when it reaches said surface;

said mask additionally has at least one second electrode, the first electrode being positioned between the second electrode and the sample holder, said second electrode being positioned at the level of the through-opening and, in the course of step d), there is electrical interaction with the particle passing through the opening by said electrodes and the surface together forming an electrostatic lens exerting an electrical influence on the trajectory of said particles;

e) the relative position of the source and of the opening is detected, and a relative movement of the source and of the opening is generated, in order to position the source and the opening in appropriate respective positions so that a portion of the beam passes through the opening;

at least steps a) to d) are repeated in a subsequent desired relative position; in addition at least one of the following steps is applied:
the particles emitted by the source are concentrated into clusters,
the clusters having at least one desired characteristic selected from electric charge, mass and the ratio of electric charge to mass are filtered,
the clusters are deflected in the direction of the mask;

at least steps c) and d) are applied successively for a plurality of sources emitting particles through one and the same opening of the mask;

at least steps c) and d) are applied in parallel for a plurality of sources, each emitting particles, each through a respective opening;

the source forms the through-opening in the mask.

BRIEF DESCRIPTION OF THE DRAWINGS

Other characteristics and advantages of the invention will become apparent from the following description of some of its embodiments, given by way of non-limitative example, with reference to the attached drawings.

In the drawings.

The same reference symbols denote identical or similar elements in the various diagrams.

DETAILED DESCRIPTION OF PREFERRED EMBODIMENTS

Figure 1:
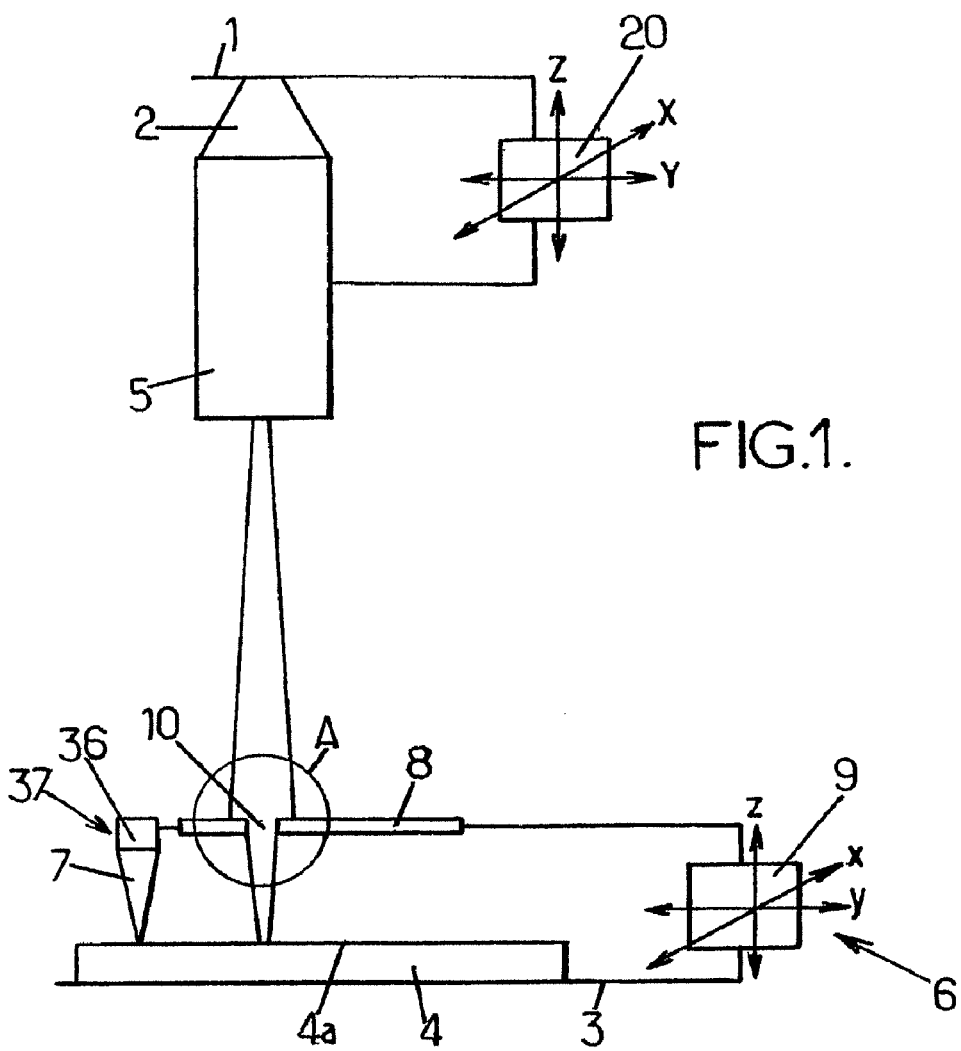
FIG. 1 is a diagrammatic view of a nanofabrication installation.

FIG. 1 shows very diagrammatically a nanofabrication installation comprising a source 1 emitting a beam 2 of electrically charged particles of matter towards a sample 4 to be formed, carried by a sample holder 3 of the installation. The source 1 emits a beam 2 of elementary particles (ions) and/or of clusters, or droplets, each of these clusters having a respective overall electric charge. It is, for example, a liquid metal ion source (LMIS, as described for example in WO 96/02065) that emits, when it is powered in a suitable manner, for example with a current of about 40 µA, ion clusters, for example clusters of gold $Au^+$ ions of the order of a nanometre in size. This beam is emitted towards the sample 4 either directly or via a beam shaping device 5, which will be described in more detail later in connection with FIG. 3.

The installation in FIG. 1 also has a device for near-field detection 6 of the conventional type, of the atomic force microscope (AFM) type, or scanning tunnelling microscope (STM) or other suitable detecting device. Conventionally, the atomic force microscope has a head 37 provided with a tip 7 carried by a flexible beam or cantilever 36 (perpendicular to the plane of FIG. 1) and moved by a positioning device 9 in the vicinity of the surface 4a of the sample to be formed, for detecting the relief and/or the chemical composition of said surface. By "in the vicinity of the surface" is meant that the tip 7 can be maintained in contact with the surface or at a very small distance from the latter for the detection of said surface. The positioning device 9 can for example move the sample holder 3 carrying the sample according to the directions x and y substantially corresponding to the plane of surface 4a of the sample and move the head 37 according to an axis z normal to this surface, or in any other suitable manner. The positioning device is for example constructed in the form of piezoelectric devices, the elongation of which is proportional to an electrical quantity passing through said device, to provide accuracy, for example at the nanometre scale, for the movement.

As can also be seen in FIG. 1, the head 37 is, according to one example, integral in movement, at least according to the x and y axes, with a mask 8 arranged between the source 1 and the sample 4 in the path of the clusters, optionally originating from the beam shaping device 5, in the direction of the sample 4. As a variant, the mask 8 is maintained in the installation with a position that is known in advance relative to the head 37, to within the resolution of the detecting device. The mask rests for example on the substrate, raised relative to the latter by blocks. Thus, the mask 8 can be moved independently of the head 37 provided that their respective positions are known at any given moment, being calculated for example from their respective initial position and from the movement of one and/or of the other relative to this initial position.

Figure 2:
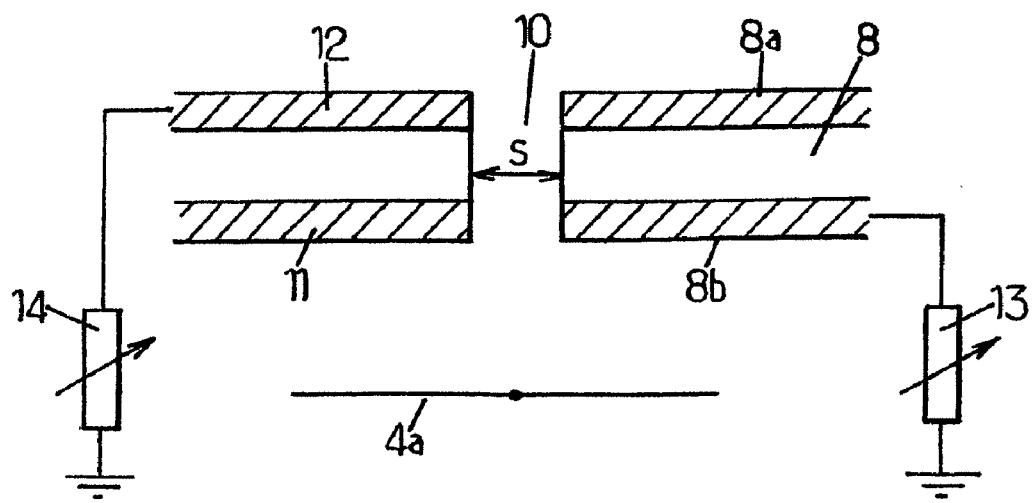
FIG. 2 is an enlarged, detailed diagrammatic view of portion A in FIG. 1.

As shown in more detail in FIG. 2, the mask 8 extends in a substantially planar manner, parallel to the plane of the surface 4a of the sample, with a thickness of the order of about a hundred nanometres. It has a through-opening 10 extending from the upper surface 8a to the lower surface 8b of the mask 8. The through-opening 10 is for example made normally to the upper and lower surfaces of the mask 8 and has for example a diameter of the order of 10 nm.

In the example of application shown, an electrostatic lens is produced near the surface 4a of the sample 4 to be formed. In an example of application that is purely for the purposes of illustration, shown in FIG. 2, a first electrode 11 is provided on a lower face 8b of the mask at the level of the opening 10. A second electrode 12 is provided, upstream from the first electrode on the source-surface path of the clusters, for example on the upper surface 8a of the mask at the level of the through-opening 10. In the example shown, the assembly formed from the second electrode 12, the first electrode 11, and the surface 4a of the sample, forms the electrostatic lens. A first generator 13 applies a first adjustable electric potential to the first electrode 11, and a second generator 14 applies a second adjustable electric potential to the second electrode 12.

The mask 8 that has just been described can for example be made with a suitable fabrication tool of the focused ion beam nanofabrication (nanoFIB) type. For example, two silicon membranes are each metallized on one face, and pierced with a hole that is intended to form the opening 10. Then these two membranes are assembled by their non-metallized face, for example by molecular bonding. Different examples of stacks of two or more membranes can be constructed, depending on the properties that are desired for the lens.

Shaping the beam in an example using the beam shaping device 5 in FIG. 1 is now described with reference to FIG. 3. The beam 2 emitted by the source 1 is first condensed and focused by an electrostatic lens 15. Then an ExB velocity filter, called a Wien filter, is applied to this beam, making it possible to separate ions, clusters that are neutral overall, and charged clusters having a desired mass, charge, or mass/electric charge ratio. Then a deflecting device 17, for example produced in the form of a double-quadrupole deflection, is used for guiding the beam of clusters 2 towards a precise spot, of the order of a few square microns ($\mu m^2$) of area of the surface 4a of the sample.

In this description, the opening 10 is a substantially punctiform hole. However, it is also envisaged to implement the invention for any type of opening in the form of a slit extending substantially in one direction, segment of a straight line, of a curve, etc., corresponding to a pattern to be deposited.

Figure 3:
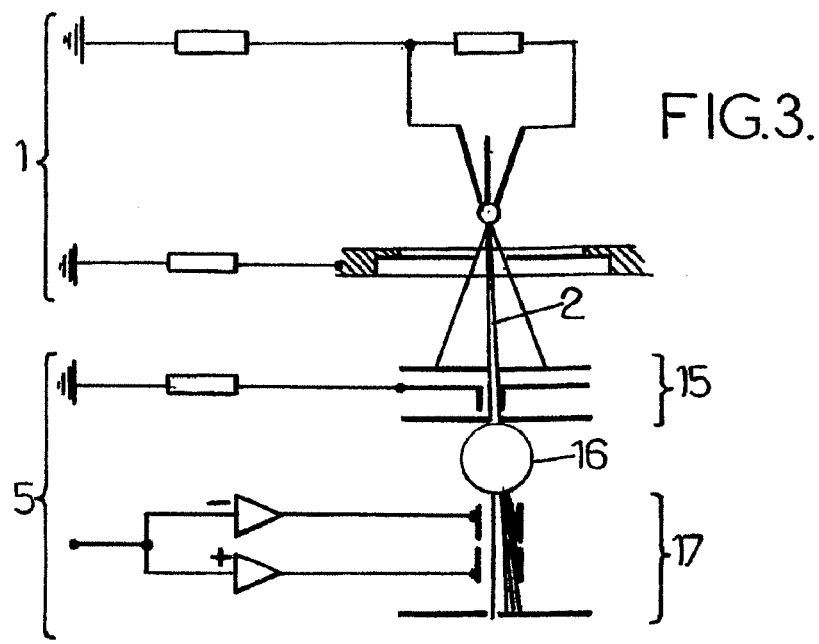
FIG. 3 is a diagrammatic view of an example of application of a beam shaping device for the installation in FIG. 1.

As a variant, a beam device such as that described with reference to FIG. 3 is not necessarily used. In this case, the source 1 is arranged in the vicinity of the mask 8, and the upper electrode of the mask 8 can serve as extractor for the source 1, if the opening 10 is a circular hole, to guarantee symmetry of the electrostatic field that is necessary for extraction.

During use of the installation, the opening 10 is placed opposite to the position for forming the surface 4a of the sample. This positioning is carried out for example by means of the positioning device 9 by detecting the geometric and/or chemical or other characteristics of the surface 4a of the sample, by means of the tip 7 until the desired position is identified. Then the sample holder or the mask 8 is moved so that the through-opening 10 is above the desired position.

Figure 4:
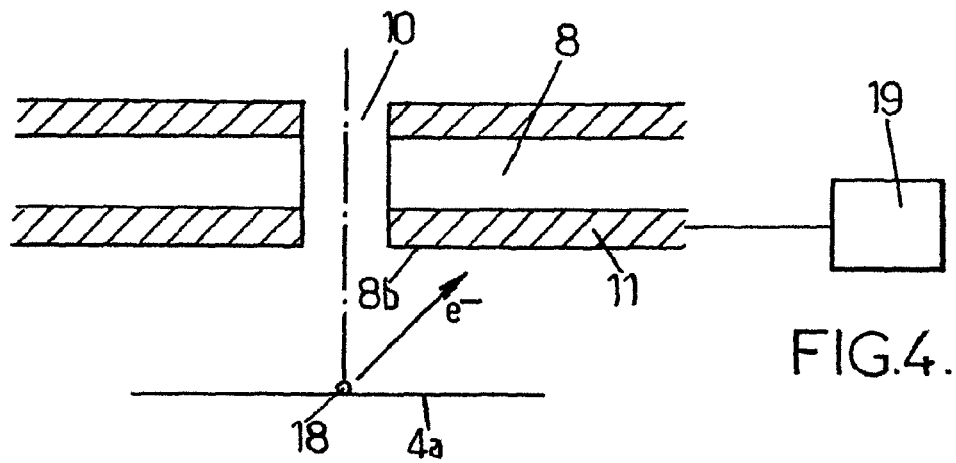
FIG. 4 is a diagrammatic view corresponding to FIG. 2 of a detection function implemented with the installation.

In a first example of implementation, as shown in FIG. 4, there can be interaction, by means of the first electrode 11, when the latter is arranged on the lower face 8b of the mask 8, at the level of the opening 10, with the electrically charged clusters 18 arriving on the sample surface 4a. If the clusters are positively charged, such as clusters of $Au^+$ ions for example, electrons $e^-$ will be emitted in the direction of the first electrode 11, and it will be possible for these electrons to be detected by a suitable detector 19. In this application, "at the level of" means that the electrode is sufficiently close to the opening for a sufficient number of electrons emitted owing to the arrival of the clusters 18 on the surface 4a to be detected to provide useful information on the quantity of matter deposited. Said detection will provide monitoring of the amount of gold deposited, in the example under consideration, on the surface 4a of the sample, in the desired position, which offers a means of monitoring the length of time for which the method must be applied in this position. Once the deposit has formed, the mask can be moved, relative to the sample, to a new desired position where these steps are repeated. This new desired position can have been detected beforehand by the detecting device 6.

Figure 5:
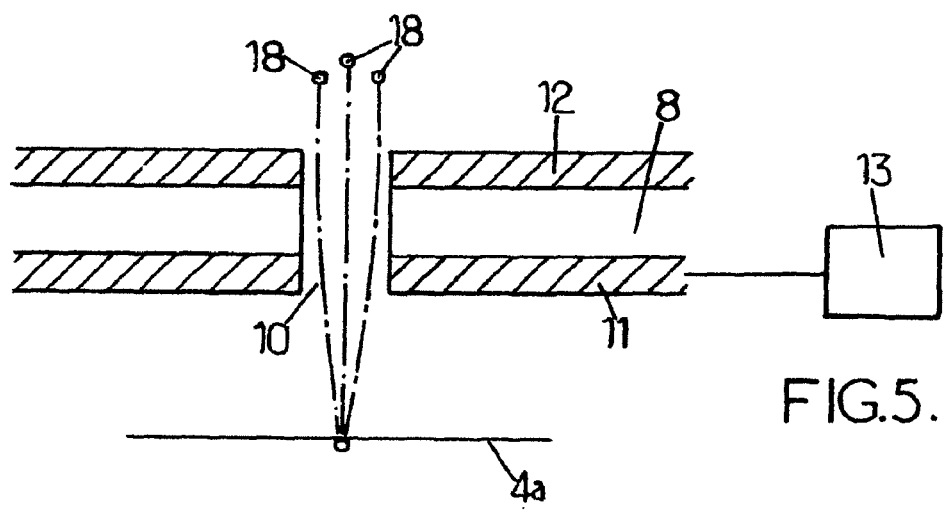
FIG. 5 is a diagrammatic view corresponding to FIG. 2 of a substrate forming function with the installation.

According to a second application, as shown in FIG. 5, the clusters 18 are electrically acted upon directly during their journey from the source 1 to the surface 4a for forming the sample. For example, a retarding potential is applied to the first electrode 11 by means of the first generator 13. As for the input electrode 12, it is maintained at earth potential or at some other potential. Consequently, an electric field is generated by the electrostatic lens, which will have the effect of focusing the clusters 18 in the direction of the desired position 2 of the surface 4a of the sample. Deposition rates of the order of 10 nm/min can thus be obtained. Moreover, as the mass and/or the charge of each of the clusters 18 is substantially predetermined for the clusters arriving at the level of the mask 8, when a beam shaping device 5 is used, by adjusting the potential applied by the first generator 13 to the first electrode 11 it is possible to exert an influence on the kinetic energy of the clusters 18 at the moment when they arrive at the level of the surface 4a of the sample 4. This results in better control over the conditions of deposition, or of implantation of the clusters 18 in the sample 4, or of forming the surface 4a. In effect, the embedding of the clusters in the surface is directly related to the kinetic energy of the latter on arrival. It can for example be controlled between a few hundred volts and 5 kV.

By "at the level of" is meant in this application that the electrode is sufficiently close to the opening for the application of an electric potential to the electrode to exert an electrical influence on the electrically charged clusters passing through the opening.

Of course, forming the surface 4a in the position under consideration can also be detected subsequently by moving the head 37 of the detecting device 6 to this position.

Then the mask 8 can be moved to another position in which the surface 4a of the sample is to be formed. This example shows a simple lens with a two-electrode mask. It is possible to increase the number of electrodes superposed at the level of the opening for more accurately exerting an influence on the clusters. The detecting device 6 can be moved independently of the source 1 until the opening 10 is positioned above the new position to be formed, of the surface 4a of the sample. All that is then required is for the source 1 to be moved or not, depending on the geometric extent of the beam 2. Without moving the source 1, it is possible to modify the characteristics of the deflecting device 17 of the beam shaping device 5 for guiding the beam 2 to the new position.

For detecting the position of the opening 10 relative to the source 1, the LMIS source is used at low current, in "Imaging" mode. The relative position of the source and mask can then be adjusted by means of the positioning device 20, or the characteristics of the deflector 17 can be changed.

It is not necessary for the mask to be aligned with the source and its beam shaping device, as it is the beam, in imaging mode, that will constantly detect the position of the mask, and align on the opening.

Alternatively, the installation can have a detecting device for detecting the relative positions of the source 1 and the opening 10.

If it is detected that the opening 10 becomes blocked again during deposition of gold ions on the mask 8, close to the opening 10, it is also possible, starting from source 1, no longer to form the surface 4a of the substrate but the opening 10 itself by re-etching the latter in a suitable manner so that it has the desired shape, by etching the gold deposits formed on its surface.

Moreover, the aberrations of this lens geometry, with openings of the nano-hole type, are very slight. If the working distance is reduced to practically zero, the magnification will reach a minimum value. The theoretical limit will be set by the phenomenon of diffraction on the Ångström scale for the massive, energetic charged particles employed.

Figure 6:
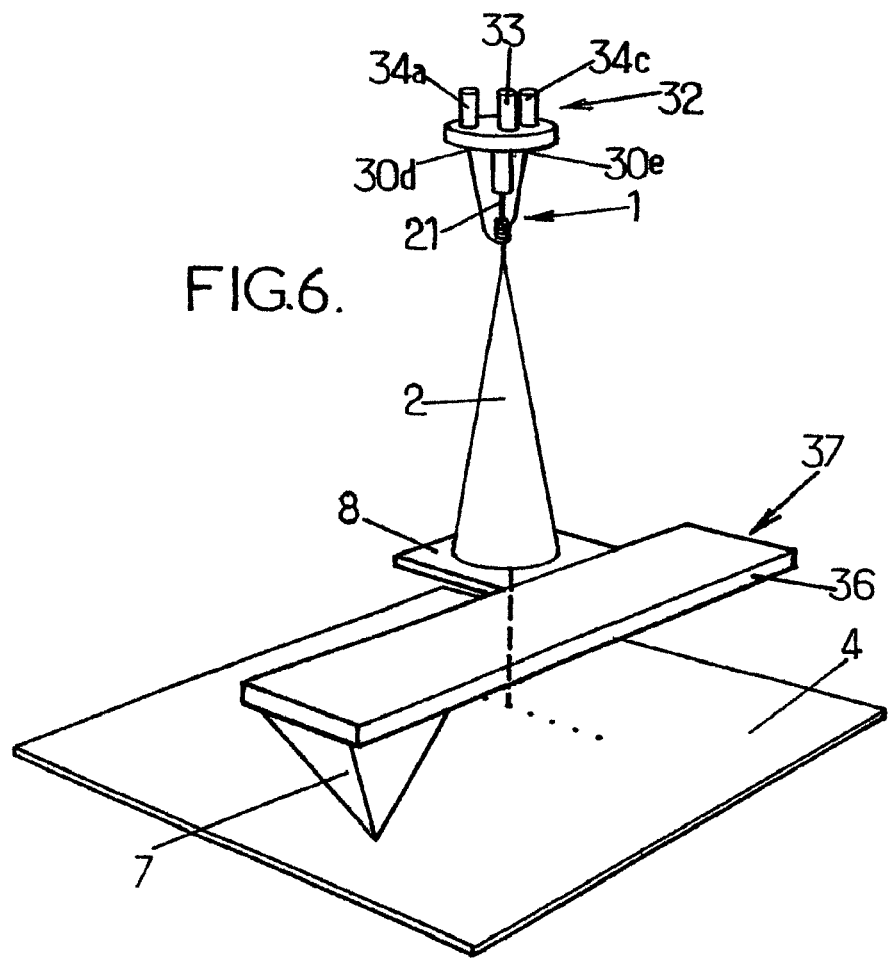
FIG. 6 is a three-dimensional diagrammatic view of a second example of the installation, after removal of the beam shaping device for greater clarity.

As shown in FIG. 6, in one variant, the mask 8 is not necessarily produced independently of the head 37 of the detecting device, with the relative positions of the mask 8 and head 37 closely correlated. In this variant, the mask 8 can be formed as a portion of the cantilever 36 of the head 37. The thickness of the mask 8 is adjusted as required, between one tenth and several tenths of a micrometre. The mask 8 is for example produced as represented by a reduced-thickness portion provided on the body of the cantilever 36, so as not to affect the rigidity and the bending characteristics of the cantilever, which were carefully established to provide a highly accurate detecting device and offer an extended useful surface for the mask.

With this arrangement it is possible:

to produce and then use a plurality of openings having variable shapes, sizes, positions and/or arrangements, being addressable by the beam of clusters individually (deposition of points, patterns) or collectively (network of patterns), this latter case permitting parallel/simultaneous transfer of the patterns defined by the mask;

to protect, by a screening effect, very effectively, the regions of the surface 4a of sample 4 close to the opening made in a mask, as said mask has a greater area than the area of the cantilever itself.

FIG. 6, which is not drawn to scale, and in which the beam shaping device 5 has been omitted, also shows a source that can be used in place of a conventional LMIS source. This source comprises a tip 21 which is generally in the form of a needle 22 having a substantially cylindrical body 23 extending both in a proximal portion 24 and a median portion 25 of the tip, and a pointed end 26 extending in a distal portion 27 of the tip as a prolongation of body 23. The external geometry of the pointed end 26, which extends over several tenths of a millimeter, is that of the tip of a tunnel-effect microscope. The terminal radius of curvature of the tip is between approximately 0.1 and 2 micrometres, preferably between 0.3 and 1 micrometre, as measured by scanning microscopy. For this purpose, the external surface 26a of the pointed end 26 will be given any geometry suitable for use of the read/write head as the needle of a tunnel-effect microscope.

The needle 22 has a long, tapered core 28 of a refractory material, for example tungsten, covered with a thin layer 29 of an electrically conducting material, for example gold. As an example, in the embodiment shown, the core 28 is formed from a tungsten wire with a diameter of 0.25 mm covered, at least partially, and at least in the distal portion 27, with a gold film a few microns in thickness.

In the median portion 25 of the tip 21 there are several turns 30a, 30b, 30c of an electric filament 30. These turns, numbering three in FIG. 7, as an example, are wrapped around the longitudinal axis of the needle 22 in the median portion and are for example made of a tungsten wire about 0.1 mm in diameter. In the example shown, the turns form a circle with a diameter of about 0.5 mm which surrounds a reservoir 31 of the electrically conducting material.

As shown in FIG. 6, the tip 21 that has just been described is mounted on a head 32, for example a head for tunnel-effect microscopy with an outside diameter of a few millimeters. Such a head 32 has for example a central capillary 33 suitable for connecting to an electric generator (not shown in FIG. 6) as well as a plurality of cross-pieces 34a, 34c electrically isolated from one another.

Figure 7:
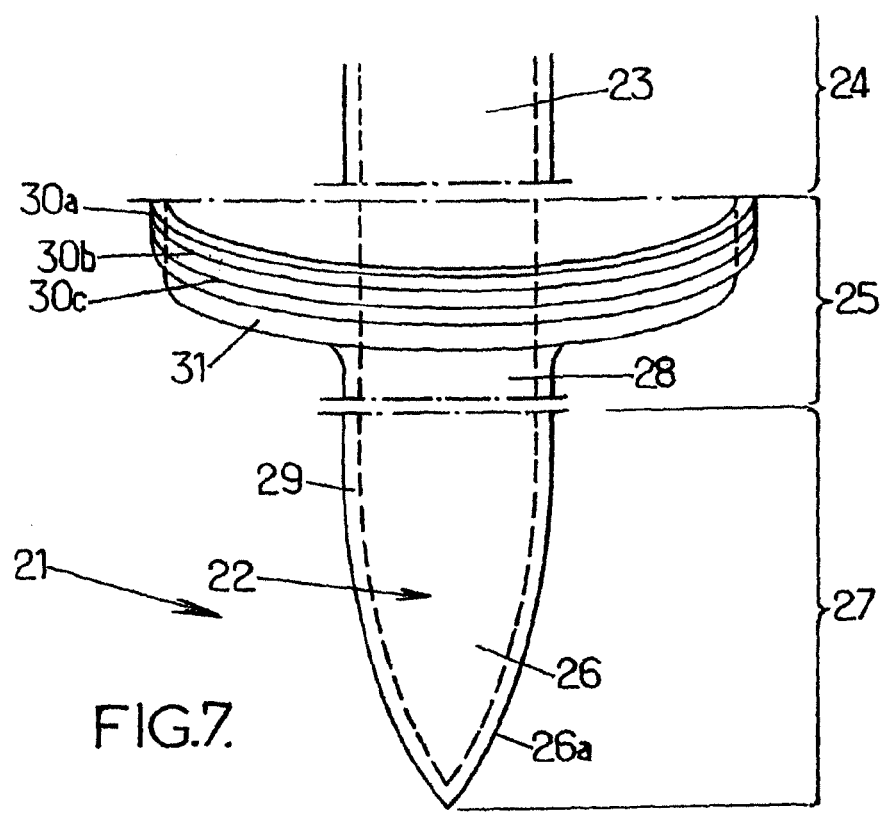
FIG. 7 is a diagrammatic view of an example of a particle source intended for equipping the installation in FIG. 6.

The tip 21, shown in FIG. 7, comprising the needle 22 and the filament 30 comprising a first end 30d and a second end 30e between which there are the turns 30a, 30b, 30c, is electrically connected to the head 32. On the one hand, the proximal portion 24 of the tip is electrically connected to the central capillary 33 powered from the first cross-piece 34a. At this level, the first end 10d of the filament 30 is electrically connected to the needle 22, in order to form a single point of electrical contact. To close the electric heating circuit, the second end 30e of the filament 30 is electrically connected to one of the insulated cross-pieces, for example cross-piece 34c, for example by crimping, or by spot welding.

The first and second cross-pieces 34a, 34c are connected to an electric generator. As for cross-piece 34c, it is electrically connected to the mask 8. The head 32 is positioned close to the mask 8. The distance between the tip 21 and the mask 8 is for example of the order of about a hundred micrometres. The electric generator is also electrically connected to the mask 8 for applying a potential difference between the mask 8 and the tip 21.

A displacement device 20 is arranged for applying a relative movement of the mask 8 and the tip 1 in one, two or three dimensions. Such a displacement device can conventionally be a positioning device of the type used in tunnel-effect microscopy, for example a device based on piezoelectric elements capable of increasing in length under the effect of the passage of an electric current in the material. In the example shown, as indicated by the three arrows X, Y, Z, the source can be moved in three directions relative to the mask, which remains fixed. Other variants of application are possible.

In the example shown, the electric generator has on the one hand a current generator connected to the two cross-pieces 34a and 34c for passing a heating current through filament 30. The electric generator also has a voltage generator arranged for applying a potential difference of a first sign between the tip and the mask, or a potential difference of a second sign opposite to the first sign between these two elements.

A first voltage generator is arranged for using source 1 in write mode (source of liquid metal ion). For this purpose, it is possible for example to use a generator of the type that applies a positive voltage of the order of 0 to 5 kilovolts to the tip 21, the mask 8 being connected to earth. The current supplied by the first generator is of the order of 1 to 10 microamperes, for example.

The second voltage generator can apply a negative voltage of the order of several volts to the tip 21, while the mask 8 is connected to earth. A current that can be less than 1 picoampere, up to of the order of 300 nanoamperes, can then flow between the tip and the mask.

The device that has just been described can be used in write mode as a source of liquid metal ion. By placing the switch in an appropriate position, the first generator applies a positive potential difference of the order of several kilovolts between the tip 1 and the mask 8. Simultaneously, the current generator activates the heat transfer device by causing a sufficient current (for example of the order of several amperes for the geometry shown) to flow in filament 30 to heat, at the level of the turns, the electrically conducting material to a temperature at least equal to its melting point. With the geometry shown, a power of 1.5 W is sufficient to reach a temperature of about 1000° C. at the level of the reservoir. In this operating mode, in write mode by emission of liquid ions, a Taylor cone forms at the end of the tip, owing to the opposing effects of the applied electric field, which tends to tear out ions from the tip, and of the surface tension of the film of liquid metal covering the needle. The potential difference applied between the tip 21 and the mask 8 forms a beam of ions of the electrically conducting metal of the layer 29 by field evaporation. These will form the portion of the sample opposite. The erosion due to extraction of matter from the tip 21 is compensated by the flow, along the needle, of the electrically conducting material from reservoir 31 liquefied by the turns of the filament which transfer the energy originating from the current generator. The material located at the end of the needle is thus constantly renewed, which provides a write mode possessing a long life.

By placing the switch in a second position, the second voltage generator applies a negative potential difference of several volts between the tip 21 and the mask 8 for operation in read mode by tunnel-effect microscopy. Under the effect of this potential difference, a current of the order of a nanoampere for example flows between the tip 21 and the mask 8, and the tip 21 then functions as a tip for tunnel-effect microscopy. A suitable detecting device, of the type used in tunnel-effect microscopy for deriving information relating to the surface 8a of the mask 8 from the measured current, is used for detecting this information. Such a detecting device is conventional in the field of tunnel-effect microscopy, it will not be described in more detail here.

In a regeneration mode, the external geometry of the end of the needle 22 can be renewed. In fact, for example following writing in liquid metal ion emission mode, the end of the tip 21 may have been subjected to severe erosion, and it is advisable to renew the geometry of this end for subsequent use of the tip 21. In this mode, without applying a potential difference between the tip 1 and the mask 8, the electrically conducting material contained in the reservoir is liquefied by heating applied by the current generator, to cause this material to flow along the tip until it regains its original geometry.

Using the device that has just been described, it is possible for example to detect, in read mode, the position of the opening 10. With the source positioned opposite the opening 10, it emits, in write mode, electrically charged clusters, as described previously. As in the embodiments described previously, the mask 8 is moved relative to the sample 4 to form other locations of the upper surface of the sample.

Alternatively, it is also possible to detect a selected position of the metallized mask 8 and etch an opening 10 in the latter corresponding to the pattern that one wishes to deposit later.

Figure 8:
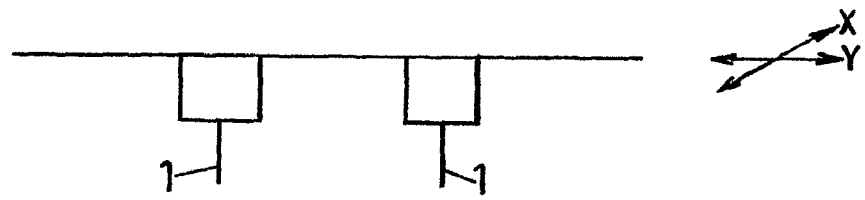
FIG. 8 is a diagram substantially corresponding to FIG. 1 for a third embodiment, in which the beam shaping devices are not shown.
Figure 8:
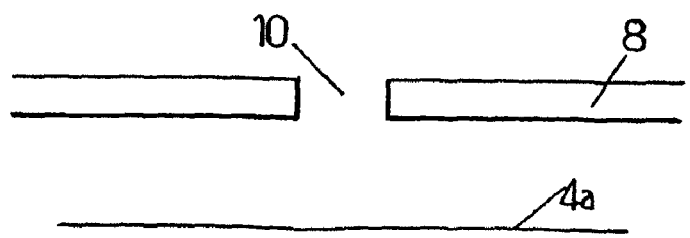

As shown in FIG. 8, it is possible to use a plurality of sources 1 each corresponding to one or other of the embodiments presented previously. These sources can contain dissimilar materials, and can be used successively for depositing different materials in one and the same position of the surface 4a through the opening 10. Alternatively, the plurality of sources can be used successively in different locations after mask 8 has been moved.

Figure 9:
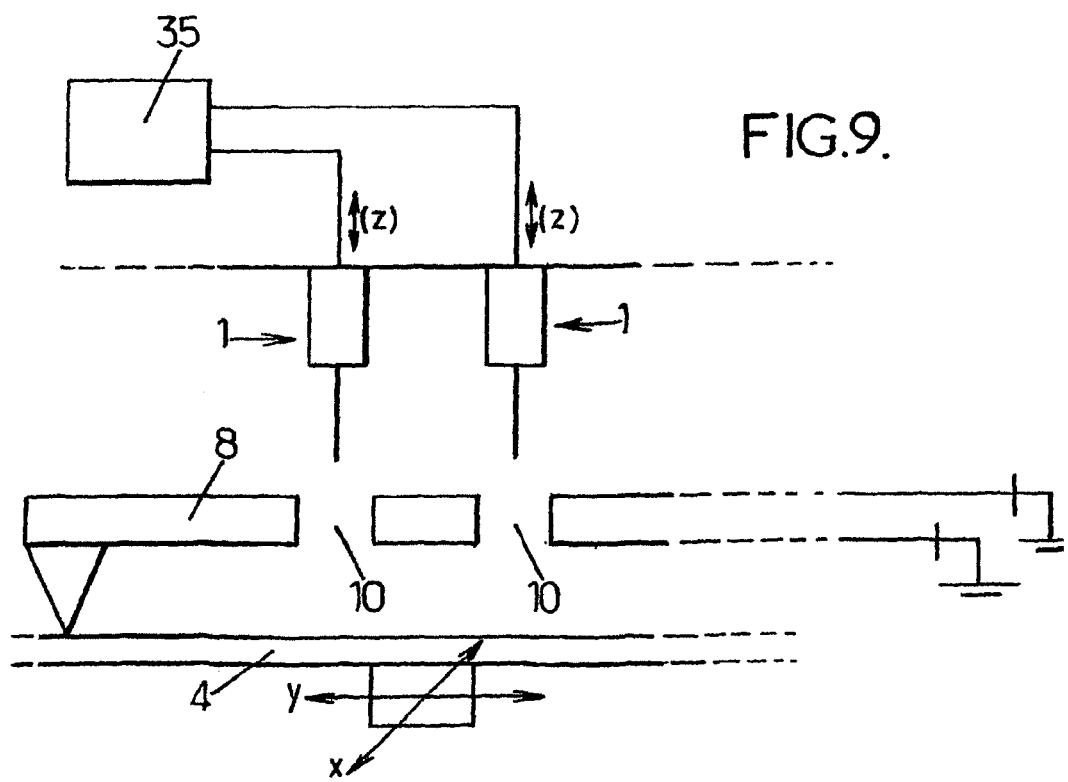
FIG. 9 is a diagram substantially corresponding to FIG. 8, for a fourth embodiment.

As shown in FIG. 9, it is also possible to apply a parallel treatment of the surface 4a of sample 4 by arranging a plurality of sources 1 each functioning opposite to an opening 10 formed in the mask 8.

Two examples of the source have been presented. The use of any other type of source of electrically charged droplets is envisaged, for example of the "electron beam ion trap" type.

The installation that has just been described can enable deposits to be employed for restoring electrical connections of microelectronic components.

Use of the installation for performing deposits of precursors for localized growth, such as precursors of carbon nanotubes, gallium arsenide nanofilaments, magnetic memory, etc., is also envisaged.

The invention claimed is:

1. Nanofabrication installation comprising:
   a sample holder arranged for receiving a sample having a surface,
   at least one source arranged for emitting a beam of electrically charged particles in the direction of the sample holder in order to form the sample,
   a sample forming mask comprising
      a lower face oriented towards the sample holder,
      an upper face opposite to the lower face and arranged for receiving said particle beam emitted by said source in the direction of the sample holder to form the sample,
      and at least one through-opening between the upper and lower faces, arranged to allow a portion of said particles to pass through it in the direction of the sample holder, a beam shaping device arranged between said source and said mask, said shaping device being arranged for applying at least one of the following arrangements:
concentration of the particles emitted by the source into clusters,
filtering of the clusters having at least one desired characteristic selected from electric charge, mass, and the ratio of electric charge to mass,
deflection of the clusters in the direction of the mask,
a device for near-field detection arranged for detecting a desired relative position of said mask and said sample;
a displacement device arranged for generating a relative movement of said mask and said sample holder in order to position the mask and the sample in said desired relative position, independently of the relative position of the source and the mask
characterized in that the mask comprises at least one first electrode at the level of the through-opening arranged in order to electrically interact with the electrically charged particles passing through the opening.

2. Installation according to claim 1, in which said mask additionally has at least one second electrode, the first electrode being positioned between the second electrode and the sample holder, said second electrode being positioned at the level of the through-opening, said electrodes and the surface of the sample together forming an electrostatic lens adapted to exert an electrical influence on the movement of said electrically charged particles passing through the opening, when an electric potential is applied to said electrodes.

3. Installation according to claim 2, additionally comprising a generator arranged for generating an electric potential in at least one structure selected from the first electrode, the second electrode and the surface of the sample.

4. Installation according to claim 1, in which said first electrode is located on the lower face of said mask.

5. Installation according to claim 4, additionally comprising a detector connected to said tower electrode, arranged for detecting electrical elementary particles detached from the sample by the arrival, on the surface, of the particles passing through the opening.

6. Installation according to claim 1, additionally comprising a generator arranged for generating an electric potential between said first electrode and the sample, in order to exert an influence on the kinetic energy of the particles between the mask and the sample.

7. Installation according to claim 1, in which the device for near-field detection comprises a head that is movable relative to the sample holder in the vicinity of the sample surface, said head being positioned in a known relative position in relation to said mask.

8. Installation according to claim 7, in which said head and said mask are integrally moveable in a plane substantially parallel to the sample surface.

9. Installation according to claim 7, in which the head comprises a tip and a flexible cantilever, said mask being formed in a reduced-thickness portion of the cantilever.

10. Installation according to claim 1, in which the through-opening comprises a narrow slit extending transversely to the path of the particles to the sample holder.

11. Installation according to claim 1, comprising a plurality of sources each arranged to emit particles of a different material in the direction of said sample holder.

12. Installation according to claim 1, in which the mask comprises a plurality of through-openings, and a first electrode at the level of each respective through-opening, each first electrode being arranged to interact electrically with the electrically charged particles passing through the corresponding opening.

13. Installation according to claim 12, comprising a plurality of sources each arranged to emit particles in the direction of said sample holder through a corresponding opening.

14. Installation according to claim 1, additionally comprising a source positioning system arranged for detecting the relative position of the source and the mask.

15. Nanofabrication installation comprising:
a sample holder arranged for receiving a sample having a surface,
at least one source arranged for emitting a beam of electrically charged particles in the direction of the sample holder in order to form the sample,
a sample forming mask comprising
a lower face oriented towards the sample holder,
an upper face opposite to the lower face and arranged for receiving said particle beam emitted by said source in the direction of the sample holder to form the sample,
and at least one through-opening between the upper and lower faces, arranged to allow a portion of said particles to pass through it in the direction of the sample holder,
a device for near-field detection arranged for detecting a desired relative position of said mask and said sample;
a displacement device arranged for generating, a relative movement of said mask and said sample holder in order to position the mask and the sample in said desired relative position independently of the relative position of the source and the mask,
a source positioning system arranged for detecting the relative position of the source and the mask,
characterized in that the mask comprises at least one first electrode at the level of the through-opening arranged in order to electrically interact with the electrically charged particles passing through the opening, wherein said positioning system comprises the source itself, configured in the form of a tip for near-field microscopy, and having on its outer surface the material forming said particles, said tip being arranged, in a first operating mode, for detecting the relative position of the tip and the mask and, in a second operating mode, for emitting said particles.

16. Installation according to claim 15, in which the source comprises a reservoir of said material, and a heating device for liquefying the material contained in the reservoir in order to cause the latter to flow along the tip of the source.

17. Installation according to claim 1, in which the source is arranged in order to form said opening.

18. Method of nanofabrication in which:
a) a device for near-field detection detects a desired relative position of a forming mask and a surface of a sample arranged on a sample holder,
b) a displacement device generates a relative movement of said mask and of said sample holder in order to position the mask and the sample in said desired relative position, independently of the relative position of a source and the mask, said sample forming mask comprising
a lower face oriented towards the sample holder,
an upper face opposite to the tower face,
and at least one through-opening between the upper and lower faces,
c) the sample is formed by causing a particle beam of electrically charged particles to be emitted from the source in the direction of the sample holder, a beam shaping device is arranged between said source and mask, said shaping device being arranged for applying at least one of the following steps:

concentratin the particles emitted by the source into clusters.

filtering clusters having at least one desired characteristic selected from electric charge, mass and the ratio of electric charge to mass, deflecting the clusters in the direction of the mask, a portion of said particles passing through the through-opening in the direction of the sample holder, d) wherein there is electrical interaction with the particles passing through the through-opening by at least one first electrode of the mask arranged at the level of the through-opening.

19. Method of nanofabrication according to claim 18, in which, in the course of step c), a particle reaches said surface of the sample, in order to form said surface, and detaches an electrically charged elementary particle from said surface, and in which, in the course of step d), there is interaction with the particles passing through the opening, detecting said electrically charged elementary particle with said first electrode.

20. Method of nanofabrication according to claim 18, in which, in the course of step d), there is interaction with the particle passing through the opening, by generating a potential difference between said first electrode and the surface, in order to exert an influence on the kinetic energy of said particle at the moment when it reaches said surface.

21. Method of nanofabrication according to claim 18, in which said mask additionally comprises at least one second electrode, the first electrode being positioned between the second electrode and the sample holder, said second electrode being positioned at the level of the through-opening, and in which, in the course of step d), there is electrical interaction with the particle passing through the opening by said electrodes and the surface together forming an electrostatic lens exerting an electrical influence on the trajectory of said particles.

22. Method of nanofabrication according to claim 18, in which e) the relative position of the source and the opening is detected, and a relative movement of the source and the opening is generated, in order to position the source and the opening in appropriate respective positions so that a portion of the beam passes through the opening.

23. Method of nanofabrication according to claim 18, in which at least steps a) to d) are repeated in a subsequent desired relative position.

24. Method of nanofabrication according to claim 18, in which at least steps c) and d) are implemented successively for a plurality of sources emitting particles through one and the same opening of the mask.

25. Method of nanofabrication according to claim 18, in which at least steps c) and d) are implemented in parallel for a plurality of sources each emitting particles, each through a respective opening.

26. Method of nanofabrication according to claim 18, in which the source forms the through-opening in the mask.

* * * * *

UNITED STATES PATENT AND TRADEMARK OFFICE
CERTIFICATE OF CORRECTION

PATENT NO.         : 8,101,925 B2
APPLICATION NO.    : 12/279888
DATED              : January 24, 2012
INVENTOR(S)        : Jacques Gierak It is certified that error appears in the above-identified patent and that said Letters Patent is hereby corrected as shown below:

Col. 11, line 39, claim 5, the word tower should be replaced with the word -- lower --

Col. 12, line 61, claim 18, the word tower should be replaced with the word -- lower --

Col. 13, line 3, claim 18, the word concentratin should read -- concentrating --

Col. 13, line 4, claim 18, the "." after clusters should be replaced by a "," therefore read -- clusters, --

Col. 14, line 10, claim 22, the portion reading which e) should read which -- c) --

Signed and Sealed this
Third Day of April, 2012

David J. Kappos
*Director of the United States Patent and Trademark Office*